(12) United States Patent
    Nakai (10) Patent No.: US 9,953,980 B2
(45) Date of Patent: Apr. 24, 2018

(54) OPERATIONAL AMPLIFIER CIRCUIT

(71) Applicant: MITSUBISHI ELECTRIC CORPORATION, Chiyoda-ku, Tokyo (JP)

(72) Inventor: Takayuki Nakai, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/329,433

(22) PCT Filed: Sep. 29, 2014

(86) PCT No.: PCT/JP2014/075939
§ 371 (c)(1),
(2) Date: Jan. 26, 2017

(87) PCT Pub. No.: WO2016/051473
PCT Pub. Date: Apr. 7, 2016

(65) Prior Publication Data
US 2017/0213831 A1    Jul. 27, 2017

(51) Int. Cl.
*H03F 3/26*  (2006.01)
*H01L 27/092* (2006.01)
*H03F 3/45*  (2006.01)
*H03F 3/30*  (2006.01)

(52) U.S. Cl.
CPC ...... *H01L 27/0928* (2013.01); *H01L 27/0925* (2013.01); *H01L 27/0927* (2013.01); *H03F 3/3013* (2013.01); *H03F 3/45224* (2013.01); *H03F 2203/30006* (2013.01); *H03F 2203/45006* (2013.01); *H03F 2203/45281* (2013.01)

(58) Field of Classification Search
CPC ............... H03F 3/16; H03F 3/26; H03F 3/45
USPC ........................... 330/255, 264, 277
See application file for complete search history.

(56) References Cited

U.S. PATENT DOCUMENTS

| 4,730,168 A | 3/1988 | Senderowicz |
| 5,187,429 A * | 2/1993 | Phillips ............... G05F 3/247 |
| | | 323/314 |
| 7,262,662 B2 | 8/2007 | Adachi |

(Continued)

FOREIGN PATENT DOCUMENTS

| JP | 62117360 A | 5/1987 |
| JP | 11112247 A | 4/1994 |

(Continued)

OTHER PUBLICATIONS

International Search Report (PCT/ISA/210) dated Nov. 11, 2014, by the Japanese Patent Office as the International Searching Authority for International Application No. PCT/JP2014/075939.

(Continued)

*Primary Examiner* — Steven J Mottola
(74) *Attorney, Agent, or Firm* — Buchanan Ingersoll & Rooney PC (57) ABSTRACT

In an output amplifier stage of an operational amplifier circuit, the first p-well of the first nMOSFET and the second p-well of the second nMOSFET are connected to the fourth node. Further, the first n-well of the first pMOSFET and the second n-well of the second pMOSFET are connected to the fifth node. At least one of the fourth node and the fifth node is connected to an output terminal VOUT.

8 Claims, 9 Drawing Sheets

(56) References Cited

U.S. PATENT DOCUMENTS

| | | |
|---|---|---|
| 7,522,159 B2 | 4/2009 | Miyata et al. |
| 7,898,332 B2 | 3/2011 | Deguchi et al. |
| 7,920,027 B2 | 4/2011 | Keerti |
| 8,350,609 B2 | 1/2013 | Araki et al. |
| 8,664,727 B2 | 3/2014 | Harada |
| 2002/0032893 A1 | 3/2002 | Brooks et al. |
| 2004/0131211 A1 | 7/2004 | Miyata et al. |
| 2005/0077944 A1 | 4/2005 | Brooks et al. |
| 2005/0231284 A1 | 10/2005 | Adachi |
| 2006/0132177 A1 | 6/2006 | Brooks et al. |
| 2009/0251217 A1 | 10/2009 | Keerti |
| 2010/0109781 A1 | 5/2010 | Deguchi et al. |
| 2010/0127334 A1 | 5/2010 | Harada |
| 2012/0229197 A1 | 9/2012 | Araki et al. |

FOREIGN PATENT DOCUMENTS

| | | |
|---|---|---|
| JP | 7235844 A | 9/1995 |
| JP | 7273568 A | 10/1995 |
| JP | 2001-211076 A | 8/2001 |
| JP | 2004-173264 A | 6/2004 |
| JP | 2005-333624 A | 12/2005 |
| JP | 2010-114689 A | 5/2010 |
| JP | 2010129645 A | 6/2010 |
| JP | 2010-178094 A | 8/2010 |
| JP | 2011-517232 A | 5/2011 |
| JP | 2012-186688 A | 9/2012 |

OTHER PUBLICATIONS

Written Opinion (PCT/ISA/237) dated Nov. 11, 2014, by the Japanese Patent Office as the International Searching Authority for International Application No. PCT/JP2014/075939.

Japanese Office Action dated Nov. 28, 2017 in corresponding Japanese Patent Application 2016-551360 (Machine Translation).

Phillip E. Allen et al., "CMOS Analog Circuit Design", Second Edition, p. 224, Copyright 2002 by Oxford University Press, Inc.

\* cited by examiner

OPERATIONAL AMPLIFIER CIRCUIT

TECHNICAL FIELD

The present invention relates to an operational amplifier circuit, especially to an operational amplifier circuit having a Class AB push-pull source follower circuit as an output amplifier stage.

BACKGROUND ART

As a technique capable of reducing consumption current in a bias state, and increasing the maximum output current at a time when a load is driven in an operational amplifier circuit, a technique to make an output amplifier stage in an operational amplifier circuit operate in a Class AB mode (for example, Nonpatent literature 1) is put to practical use. As an operational amplifier circuit with a Class AB output, an operational amplifier circuit using a push-pull source follower circuit exists. The operational amplifier circuit using the conventional push-pull source follower circuit has a problem that the output voltage range is narrow and the frequency characteristics deteriorate.

CITATION LIST

Non Patent Literature

Nonpatent literature 1: "CMOS Analog Circuit Design Second Edition," p. 224, P. E. Allen, D. R. Holberg, Oxford

SUMMARY OF INVENTION

Technical Problem

The present invention is aimed at providing an operational amplifier circuit that suppresses deterioration of frequency characteristics and prevents a range of an output voltage from being narrowed.

Solution to Problem

An operational amplifier circuit of the present invention includes an output amplifier stage that amplifies a first voltage of a differential amplifier stage outputting the first voltage, and that outputs a voltage that is amplified from an output terminal.

The output amplifier stage includes:
- a first nMOSFET in which a first p-well is formed, a gate and a drain which are short-circuited are connected to a first node, and a source is connected to a second node;
- a second nMOSFET in which a second p-well is formed, a gate is connected to the first node, a drain is connected to a first reference terminal, and a source is connected to the output terminal;
- a first pMOSFET in which a first n-well is formed, a gate and a drain which are short-circuited are connected to a third node, and a source is connected to the second node; and
- a second pMOSFET in which a second n-well is formed, a gate is connected to the third node, a drain is connected to a second reference terminal, and a source is connected to the output terminal.

The first p-well and the second p-well are connected to a fourth node,
the first n-well and the second n-well are connected to a fifth node,
and at least one of the fourth node and the fifth node is connected to the output terminal.

Advantageous Effect of Invention

According to the present invention, it is possible to provide an operational amplifier circuit that suppresses deterioration of frequency characteristics and prevents a range of an output voltage from being narrowed.

DESCRIPTION OF EMBODIMENTS

First Embodiment

Hereinafter, an operational amplifier circuit 200 and an operational amplifier circuit 200-1 will be described. In the following explanation, a voltage is referred to as a voltage <VOUT>, and a terminal is referred to as a terminal VOUT. The voltage <VOUT> represents a voltage of the terminal VOUT. Further, a voltage of a terminal has the same meaning as an electric potential of the terminal.

Explanation of a Configuration of the Operational Amplifier Circuit 200

Figure 1:
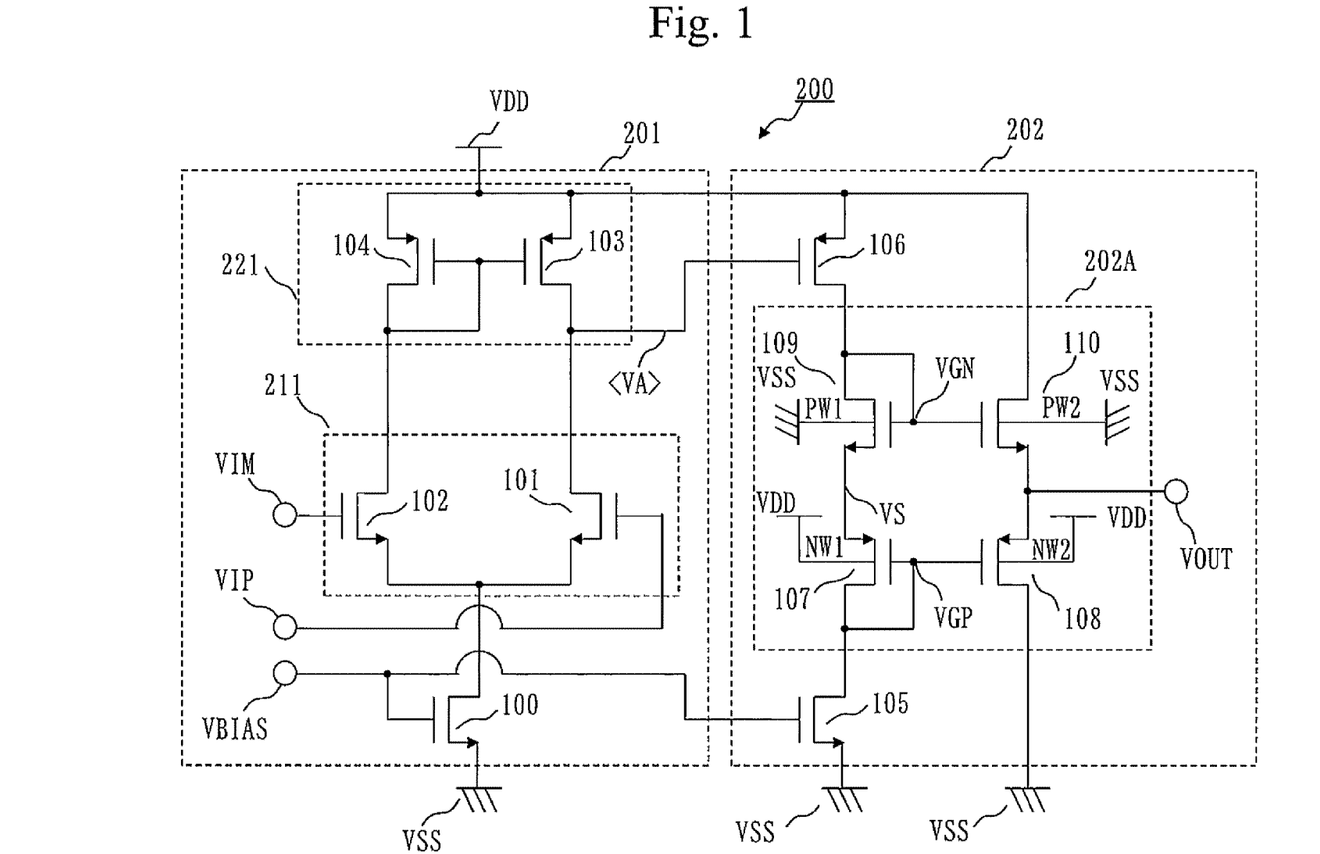
FIG. 1 is a diagram of a first embodiment, which is a circuit diagram of an operational amplifier circuit 200.

FIG. 1 illustrates a circuit configuration of the operational amplifier circuit 200 having a push-pull source follower circuit as a premise of the operational amplifier circuit 200-1 of the first embodiment. The push-pull source follower circuit corresponds to a region 202A of an output amplifier stage 202 in FIG. 1. The operational amplifier circuit 200 includes a differential input terminal VIP as a non-inverted input terminal, a differential input terminal VIM as an inverted input terminal, a bias input terminal VBIAS and the output terminal VOUT. The operational amplifier circuit 200 includes a differential amplifier stage 201 and the output amplifier stage 202. The differential amplifier stage 201 amplifies a potential difference between the differential input terminal VIP and the differential input terminal VIM, and outputs the first voltage <VA>. The output amplifier stage 202 amplifies the first voltage <VA> output from the differential amplifier stage 201, and outputs the amplified voltage from the output terminal VOUT as an output voltage <VOUT> being the second voltage.

The differential amplifier stage 201 includes an nMOSFET 100, a differential pair 211 and an active load 221. The nMOSFET 100 receives at the gate a bias voltage input from the bias input terminal VBIAS, and generates a bias current. The differential pair 211 includes an nMOSFET 101 and an nMOSFET 102. The active load 221 includes a pMOSFET 103 and a pMOSFET 104.

(1) The output amplifier stage 202 includes the first nMOSFET 109, the second nMOSFET 110, the first pMOSFET 107, the second pMOSFET 108, the third nMOSFET 105 and the third pMOSFET 106.

(2) The sources of the second nMOSFET 110 and the second pMOSFET 108 are connected to the output terminal VOUT.

(3) The first nMOSFET 109 is a replica of the second nMOSFET 110.

(4) The first pMOSFET 107 is a replica of the second pMOSFET 108.

(5) The third pMOSFET 106 receives at the gate and amplifies the first voltage <VA> output from the differential amplifier stage 201.

(6) The third nMOSFET 105 receives at the gate a bias voltage input from the bias input terminal VBIAS and generates a bias current.

(1) In the output amplifier stage 202, a gate terminal VGN of the first nMOSFET 109 is connected to the drain of the first nMOSFET 109 and the drain of the third pMOSFET 106.

(2) A gate terminal VGP of the first pMOSFET 107 is connected to the drain of the first pMOSFET 107 and the drain of the third nMOSFET 105.

(3) The sources of the first nMOSFET 109 and the first pMOSFET 107 are connected with each other.

(4) In the second nMOSFET 110 and the second pMOSFET 108, the sources are connected to the output terminal VOUT, the gates are connected to the gate terminal VGN and the gate terminal VGP, and the drains are connected to a power terminal VDD and a ground terminal VSS, respectively.

(5) Further, well potentials of the first nMOSFET 109 and the second nMOSFET 110 are supplied from the ground terminals VSS.

(6) Well potentials of the first pMOSFET 107 and the second pMOSFET 108 are supplied from the power terminals VDD.

In FIG. 1, the first nMOSFET 109 and the first pMOSFET 107 generate a potential difference <VG> in Equation (1) as follows corresponding to the bias current supplied from the third nMOSFET 105 between the gate terminal VGN and the gate terminal VGP, and bias the second nMOSFET 110 and the second pMOSFET 108.

$$<VG> = <VGN> - <VGP> \quad \text{Equation (1)}$$

That is, the first nMOSFET 109 and the first pMOSFET 107 act as replicas of the second nMOSFET 110 and the second pMOSFET 108, and thereby realize a Class AB operation. Here, gate widths of the first pMOSFET 107, the second pMOSFET 108, the first nMOSFET 109 and the second nMOSFET 110 are W107, W108, W109 and W110, respectively, and gate lengths thereof are L107, L108, L109 and L110, respectively. Further, when Equation (2) as follows is established, an electric current flowing through the second nMOSFET 110 and the second pMOSFET 108 in a bias state is N times as large as an electric current flowing through the first nMOSFET 109 and the first pMOSFET 107.

$$(W108/L108)/(W107/L107) = (W110/L110)/(W109/L109) \quad \text{Equation (2)}$$
$$= N$$

According to the configuration as illustrated in FIG. 1, in the output amplifier stage 202, the well potentials of the first pMOSFET 107 and the second pMOSFET 108 are connected to the power terminals VDD, and the well potentials of the first nMOSFET 109 and the second nMOSFET 110 are connected to the ground terminals VSS being at a ground potential. On the other hand, values of the source potentials of the first pMOSFET 107, the second pMOSFET 108, the first nMOSFET 109 and the second nMOSFET 110 are between the ground potential and the power source potential. Therefore, since p-n junctions between the sources and the wells of the first pMOSFET 107, the second pMOSFET 108, the first nMOSFET 109 and the second nMOSFET 110 are biased in the reverse direction, an absolute value of a threshold voltage increases due to a substrate bias effect compared to a case of zero bias, that is, when a source-well voltage is zero.

Here, for the operational amplifier circuit 200 as illustrated in FIG. 1 to correctly operate, it is necessary for all the MOSFETs configuring the operational amplifier circuit 200 to operate in a strong inversion and saturated region. That is, it is necessary to operate in a state wherein a gate-source voltage is larger than the threshold voltage, and a drain-source voltage is larger than a voltage value obtained by subtracting the threshold voltage from the gate-source voltage. Therefore, when the threshold voltages of the MOSFETs increase, the range of the voltage output from the output terminal VOUT of the operational amplifier circuit 200 gets smaller, and restrictions for using the operational amplifier circuit 200 are increased. In order to increase the range of the output voltage of the operational amplifier circuit 200, it is necessary to lower the threshold voltages of the MOSFETs.

Figure 2:
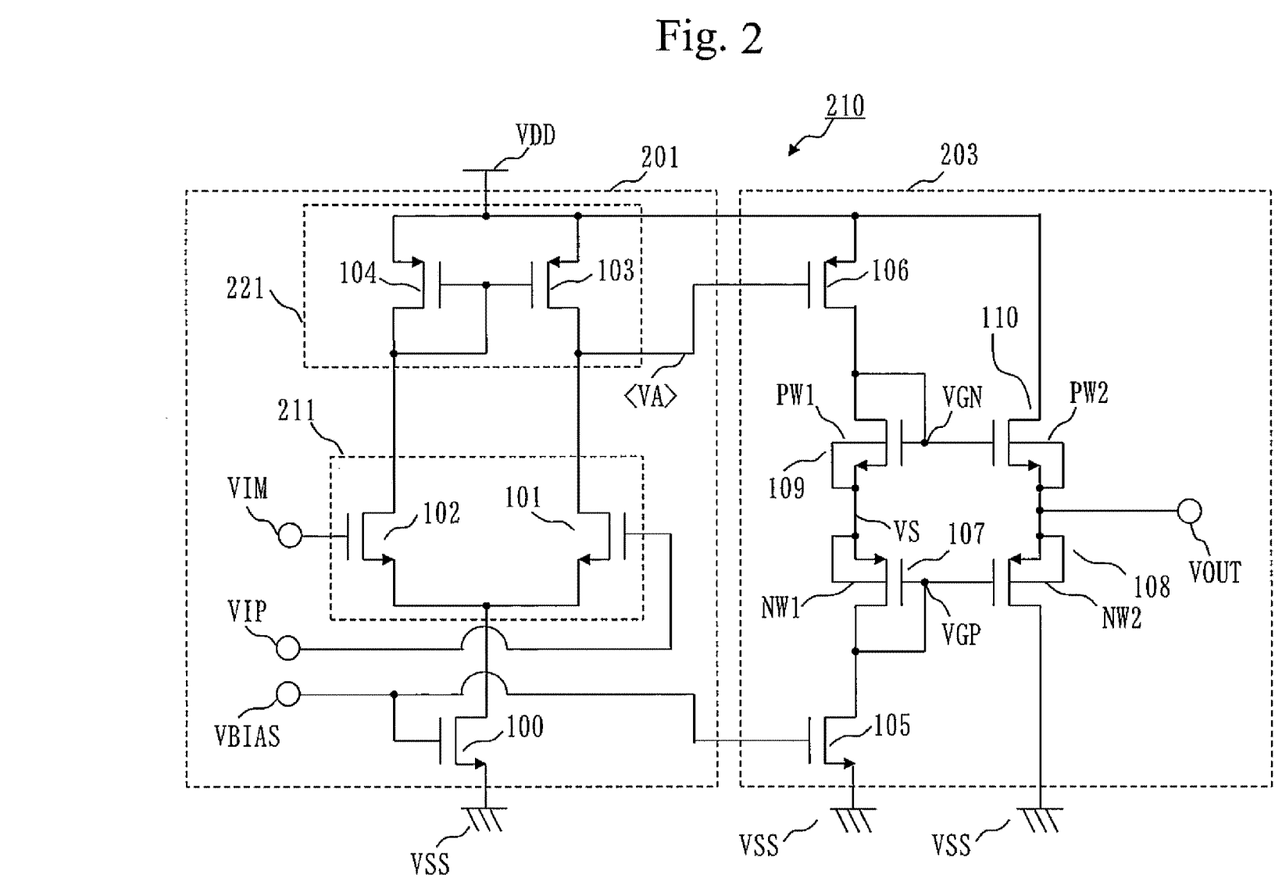
FIG. 2 is a diagram of the first embodiment, which is a circuit diagram of an operational amplifier circuit 210.

FIG. 2 is a circuit diagram of the operational amplifier circuit 210. In the operational amplifier circuit 210, a configuration of an output amplifier stage 203 is different from that of the output amplifier stage 202 of FIG. 1. In order to lower the threshold voltages, like in the output amplifier stage 203 as illustrated in FIG. 2, it is effective to connect each of the sources and wells of the first pMOSFET 107, the second pMOSFET 108, the first nMOSFET 109 and the second nMOSFET 110, thereby making source-well potential differences zero.

On the other hand, as in the output amplifier stage 203 of FIG. 2, when the source and the well are connected, since parasitic capacity of a p-n junction part of a bottom surface and a peripheral portion of the well is connected to the source terminal, the frequency characteristics deteriorate. Especially, increase of the parasitic capacity of the source terminals of the first pMOSFET 107 and the first nMOSFET 109 causes deterioration of the frequency characteristics of the output amplifier stage 203.

Figure 3:
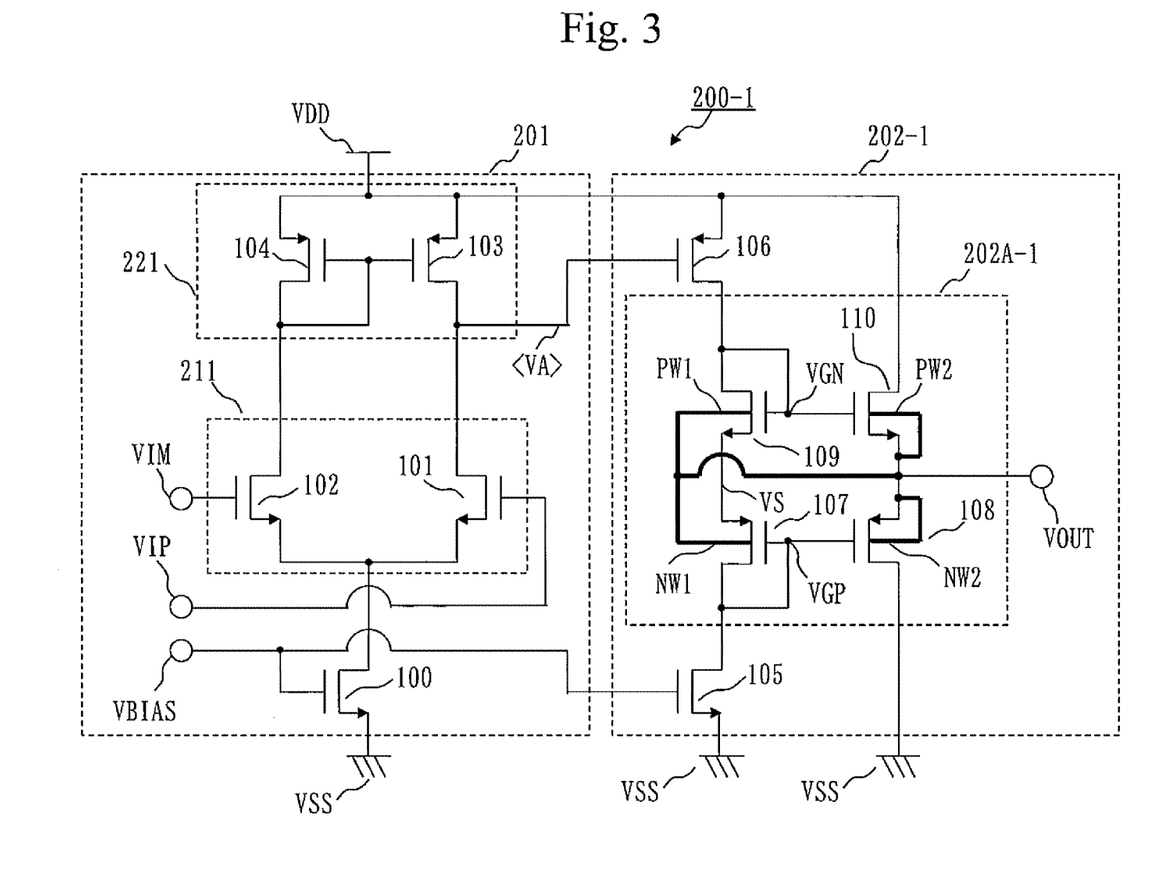
FIG. 3 is a diagram of the first embodiment, which is a circuit diagram of an operational amplifier circuit 200-1.

Thus, a configuration of the operational amplifier circuit 200-1 is illustrated in FIG. 3, which prevents the range of the output voltage generated in the operational amplifier circuit 200 in FIG. 1 from being narrowed, and suppresses deterioration of the frequency characteristics generated in the operational amplifier circuit 210 in FIG. 2.

Explanation of the Configuration of the Operational Amplifier Circuit 200-1

FIG. 3 is a circuit diagram of the operational amplifier circuit 200-1. The operational amplifier circuit 200-1 includes an output amplifier stage 202-1 that amplifies the first voltage <VA> of the differential amplifier stage 201 outputting the first voltage <VA>, and outputs the amplified voltage as the second voltage from the output terminal VOUT. In the operational amplifier circuit 200-1 in FIG. 3, a region 202A-1 of the output amplifier stage 202-1 corresponds to a push-pull source follower circuit.

In FIG. 3, parts and elements equivalent to those of the operational amplifier circuit 200 in FIG. 1 have the same reference characters allotted. In the operational amplifier circuit 200-1, the configuration of the output amplifier stage 202-1 is different from that in the operational amplifier circuit 200 of FIG. 1. In FIG. 3, a connection state of wells as a characteristic of the output amplifier stage 202-1 is illustrated in a bold line. The output amplifier stage 202-1 is characterized by the configuration wherein n-wells of the first pMOSFET 107 and the second pMOSFET 108 connect to the output terminal VOUT, and p-wells of the first nMOSFET 109 and the second nMOSFET 110 connect to the output terminal VOUT, thereby electric potentials are supplied to the n-wells and the p-wells.

Figure 4:
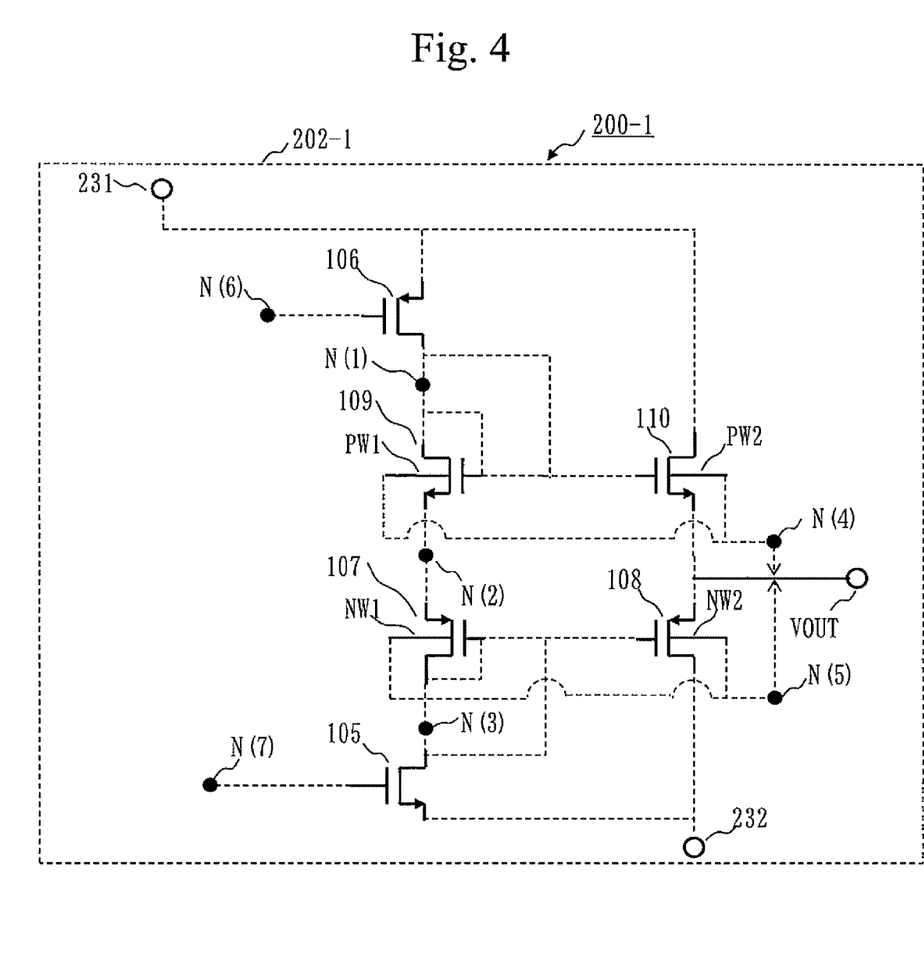
FIG. 4 is a diagram of the first embodiment, which is a basic circuit diagram including a configuration of an output amplifier stage 202-1.

The output amplifier stage 202-1 as illustrated in FIG. 3 is one concrete example, and a basic circuit configuration including the configuration of the output amplifier stage 202-1 of FIG. 3 is illustrated in FIG. 4.

FIG. 4 is the basic circuit configuration including the configuration of the output amplifier stage 202-1. FIG. 4 is a diagram illustrating a supplying method of well potentials. The configuration of the output amplifier stage 202-1 will be described using FIG. 4. In FIG. 4, the first pMOSFET 107, the second pMOSFET 108, the first nMOSFET 109, the second nMOSFET 110, the third nMOSFET 105 and the third pMOSFET 106 are shown in solid lines and a wiring is shown in a dotted line.

The output amplifier stage 202-1 as illustrated in FIG. 4 includes the first pMOSFET 107, the second pMOSFET 108, the first nMOSFET 109, the second nMOSFET 110, the third nMOSFET 105 and the third pMOSFET 106 as is the case with the output amplifier stage 202.

(1) The first p-well PW1 is formed in the first nMOSFET 109. In the first nMOSFET 109, the gate and the drain, which are short-circuited, are connected to the first node N(1), and the source is connected to the second node N(2). In FIG. 3, the gate terminal VGN of the first nMOSFET 109 corresponds to the first node N(1), and the source terminal of the first nMOSFET 109, for example, corresponds to the second node N(2).

(2) The second p-well PW2 is formed in the second nMOSFET 110. In the second nMOSFET 110, the gate is connected to the first node N(1), the drain is connected to the first reference terminal 231, and the source is connected to the output terminal VOUT. In FIG. 3, the power terminal VDD corresponds to the first reference terminal 231.

(3) The first n-well NW1 is formed in the first pMOSFET 107. In the first pMOSFET 107, the gate and the drain, which are short-circuited, are connected to the third node N(3), and the source is connected to the second node N(2). In FIG. 3, the gate terminal VGP of the first pMOSFET 107 corresponds to the third node N(3).

(4) The second n-well NW2 is formed in the second pMOSFET 108. In the second pMOSFET 108, the gate is connected to the third node N(3), the drain is connected to the second reference terminal 232, and the source is connected to the output terminal VOUT. In FIG. 3, the ground terminal VSS corresponds to the second reference terminal 232. In FIG. 3, the output terminals VOUT correspond to the fourth node N(4) and the fifth node N(5).

(5) The first p-well PW1 and the second p-well PW2 are connected to the fourth node N(4), and the first n-well NW1 and the second n-well NW2 are connected to the fifth node N(5).

(6) At least one of the fourth node N(4) and the fifth node N(5) is connected to the output terminal VOUT. That is, in the case of FIG. 3, the fourth node N(4) and the fifth node N(5) are connected to the output terminal VOUT; however, this connection is one example, and it suffices that at least one of the fourth node N(4) and the fifth node N(5) connects to the output terminal VOUT. When only the fourth node N(4) connects to the output terminal VOUT, the fifth node N(5) may connect to the power terminal VDD as in FIG. 1. Meanwhile, when only the fifth node N(5) connects to the output terminal VOUT, the fourth node N(4) may connect to the ground terminal VSS as in FIG. 1.

(7) In the third pMOSFET 106, the gate is connected to the sixth node N(6), the drain is connected to the first node N(1), and the source is connected to the first reference terminal 231.

In FIG. 3, a drain terminal of the pMOSFET 103, for example, corresponds to the sixth node N(6).

(8) In the third nMOSFET 105, the gate is connected to the seventh node N(7), the drain is connected to the third node N(3), and the source is connected to the second reference terminal 232. In FIG. 3, the bias input terminal VBIAS corresponds to the seventh node N(7).

(9) The first voltage <VA> is supplied to one of the sixth node N(6) and the seventh node N(7), and a bias voltage <VBIAS> is supplied to the other of the sixth node N(6) and the seventh node N(7). In FIG. 3, the first voltage <VA> is supplied to the sixth node N(6), and the bias voltage <VBIAS> is supplied to the seventh node N(7); however, this supply is one example. The bias voltage <VBIAS> may be supplied to the sixth node N(6), and the first voltage <VA> may be supplied to the seventh node N(7). This configuration will be described below for FIG. 9.

Explanation About an Amplification Method of the Operational Amplifier Circuit 200-1

If Equation (2) is established for each of the gate widths and the gate lengths of the first pMOSFET 107, the second pMOSFET 108, the first nMOSFET 109 and the second nMOSFET 110 in the operational amplifier circuit 200-1 as illustrated in FIG. 3, Equation (3) and Equation (4) as follows are established.

$$|<VGS107>|=|<VGS108>| \qquad \text{Equation (3)}$$

$$|<VGS109>|=|<VGS110>| \qquad \text{Equation (4)}$$

Here, <VGS107> through <VGS110> are gate-source voltages of the first pMOSFET 107, the second pMOSFET 108, the first nMOSFET 109 and the second nMOSFET 110, respectively. When an electric potential of a node, to which the sources of the first pMOSFET 107 as a replica and the first nMOSFET 109 as a replica are connected, is <VS>, Equation (5) is established from Equation (3) and Equation (4). Here, <VOUT> is a voltage of the output terminal VOUT.

$$<VS>=<VOUT> \qquad \text{Equation (5)}$$

In other words, every source potential of the first pMOSFET 107, the second pMOSFET 108, the first nMOSFET 109 and the second nMOSFET 110 is equal to the voltage of the output terminal VOUT.

Explanation of the Effect

Accordingly, when an electric potential is supplied by connecting the n-wells of the first pMOSFET 107 and the second pMOSFET 108, and the p-wells of the first nMOSFET 109 and the second nMOSFET 110 to the output terminal VOUT, source-well potential differences are zero; therefore, increase of a threshold voltage due to a substrate bias effect is suppressed. For this reason, the operational amplifier circuit 200-1 of the first embodiment as illustrated in FIG. 3 has a broader range of the output voltage than the operational amplifier circuit 200 of FIG. 1.

Furthermore, by the present configuration, since parasitic capacity existing in p-n junction parts of bottom surfaces and peripheral portions of the wells of the first pMOSFET 107 and the first nMOSFET 109 are not connected to the source terminals of the first pMOSFET 107 and the first nMOSFET 109, good frequency characteristics can be obtained. That is, according to the configuration of the operational amplifier circuit 200-1 as illustrated in FIG. 3, the output amplifier stage 202-1 has a configuration wherein the n-well of the first pMOSFET 107 and the p-well of the first nMOSFET 109 are connected to the output terminal VOUT, and the parasitic capacity is not connected to the source terminals of the first pMOSFET 107 and the first nMOSFET 109. By this configuration, it is possible to broaden the range of the output voltage by making the source-well voltages of the first pMOSFET 107, the second pMOSFET 108, the first nMOSFET 109 and the second nMOSFET 110 zero, and decreasing the threshold voltage without deterioration of the frequency characteristics.

Explanation of the Configuration Method of the Layout of the Wells

Next, the configuration method of the layout of the wells of the first pMOSFET 107, the second pMOSFET 108, the first nMOSFET 109 and the second nMOSFET 110 will be presented. First, an explanation will be provided for a case of the first pMOSFET 107 and the second pMOSFET 108.

Figure 5:
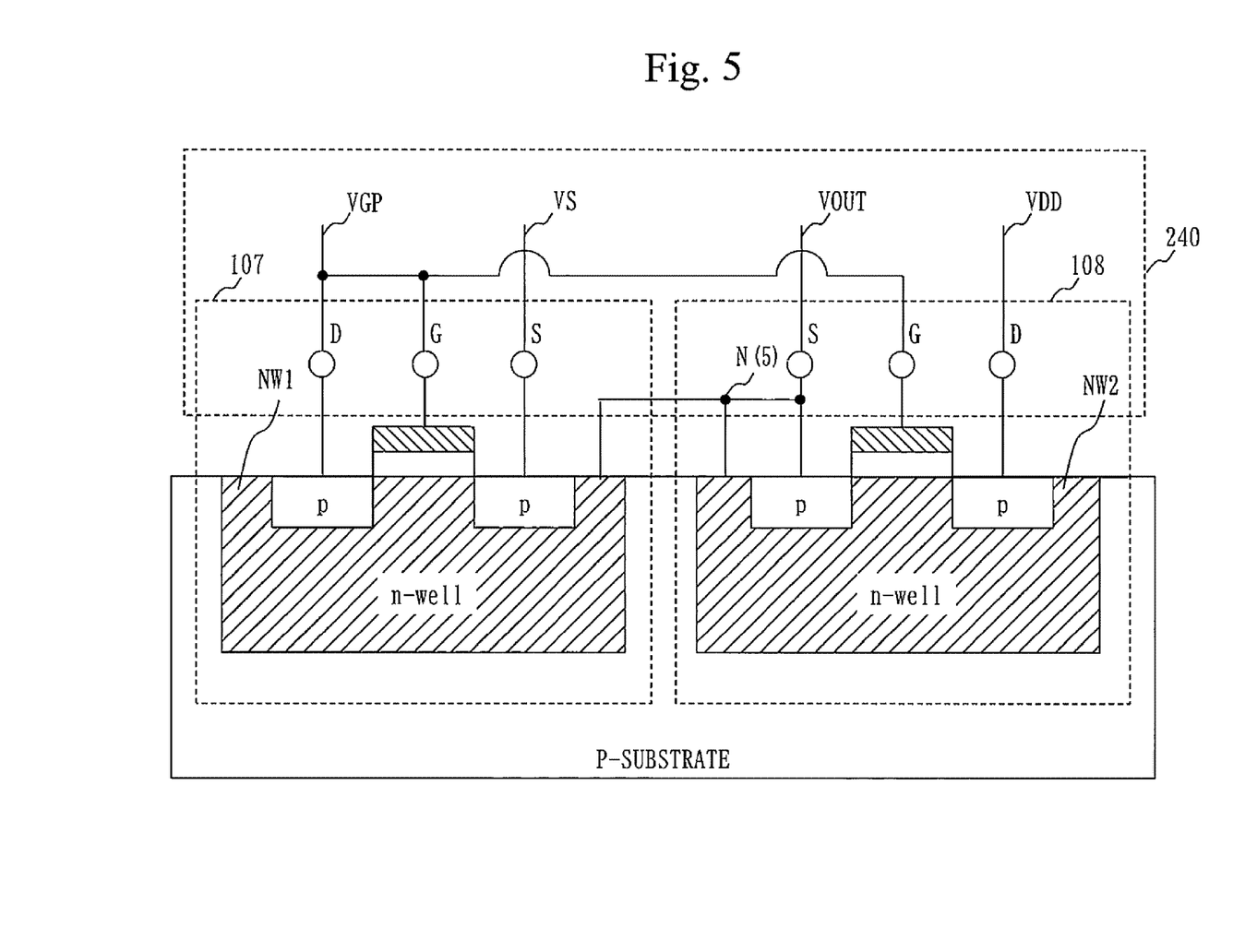
FIG. 5 is a diagram of the first embodiment, which is a diagram illustrating an example of a layout shape of the first pMOSFET 107 and the second pMOSFET 108 of the operational amplifier circuit 200-1.

FIG. 5 illustrates a configuration method of the layout of the wells in the first pMOSFET 107 and the second pMOSFET 108. As illustrated in FIG. 5, the first n-well NW1 and the second n-well NW2 formed in a p-type substrate are separated from each other, and are connected to the fifth node N(5) by a wiring layer 240. Here, the fifth node N(5) is connected to the output terminal VOUT. As illustrated in FIG. 5, by forming the first pMOSFET 107 and the second pMOSFET 108 on the first n-well NW1 and the second n-well NW2, which are electrically disconnected from each other, the first pMOSFET 107 and the second pMOSFET 108 can be realized. In this case, electric potentials of the first n-well NW1 and the second n-well NW2 are supplied from the output terminal VOUT due to the first n-well NW1 and the second n-well NW2 being both connected to the output terminal VOUT using the wiring layer 240.

Figure 6:
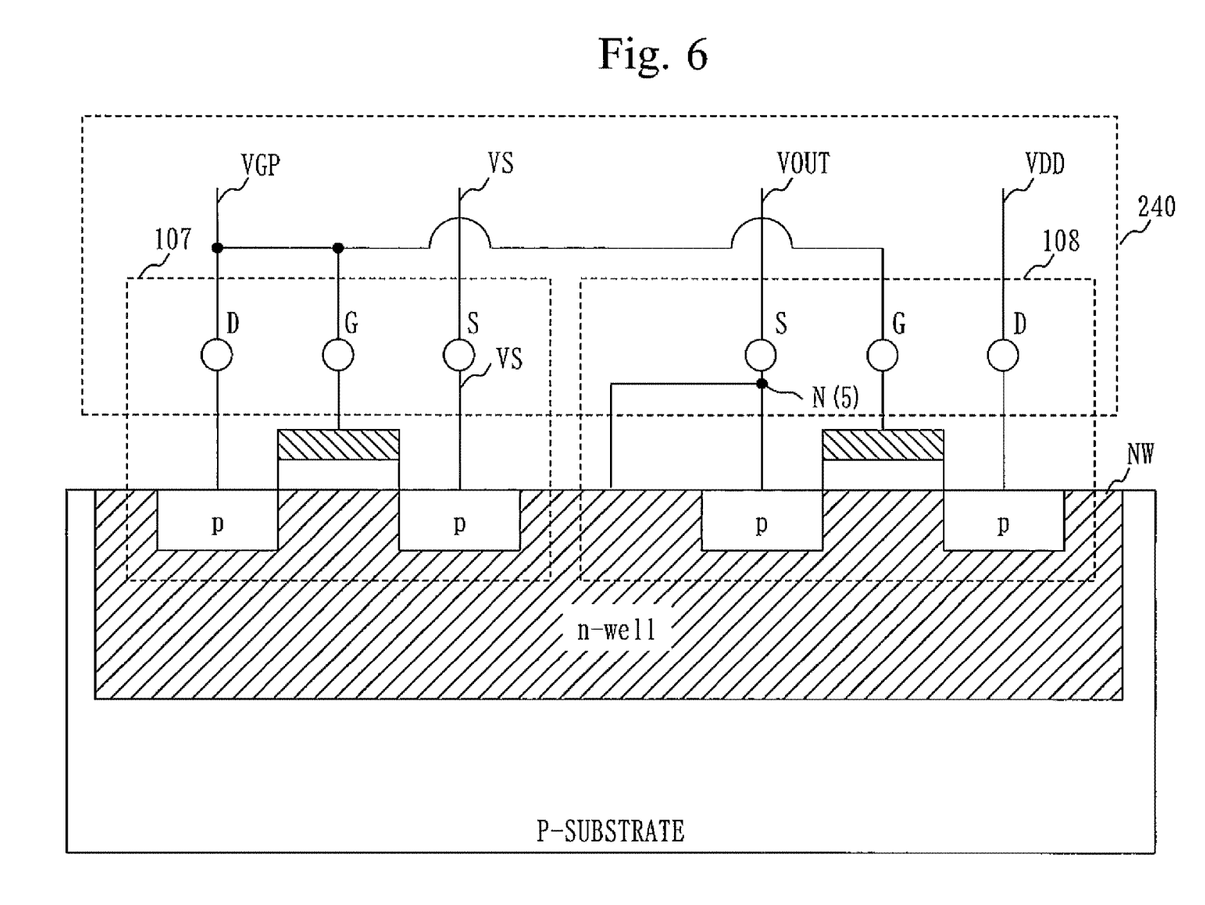
FIG. 6 is a diagram of the first embodiment, which is a diagram illustrating another example of the layout shape of the first pMOSFET 107 and the second pMOSFET 108 of the operational amplifier circuit 200-1.

FIG. 6 illustrates a configuration method in which n-wells are unified. As illustrated in FIG. 6, the first n-well NW1 and the second n-well NW2 illustrated in FIG. 5 are formed into a single region by a single n-well NW, which is connected to the fifth node N(5) by the wiring layer 240. In FIG. 6, the fifth node N(5) is connected to the output terminal VOUT. As illustrated in FIG. 6, the first pMOSFET 107 and the second pMOSFET 108 may be formed on the single n-well NW, and an electric potential of the well may be supplied from the output terminal VOUT by connecting the single n-well NW to the output terminal VOUT using the wiring layer 240.

The layout shapes of the pMOSFETs have been explained for FIG. 5 and FIG. 6. An nMOSFET can be realized by forming an n-type buried layer or an epitaxial layer, and forming thereon a p-well electrically disconnected from a p-type substrate. Thus, n and p may be replaced with p and n as for the symbols n and p in FIG. 5 and FIG. 6, and the symbols n and p in the description on FIG. 5 and FIG. 6.

Figure 7:
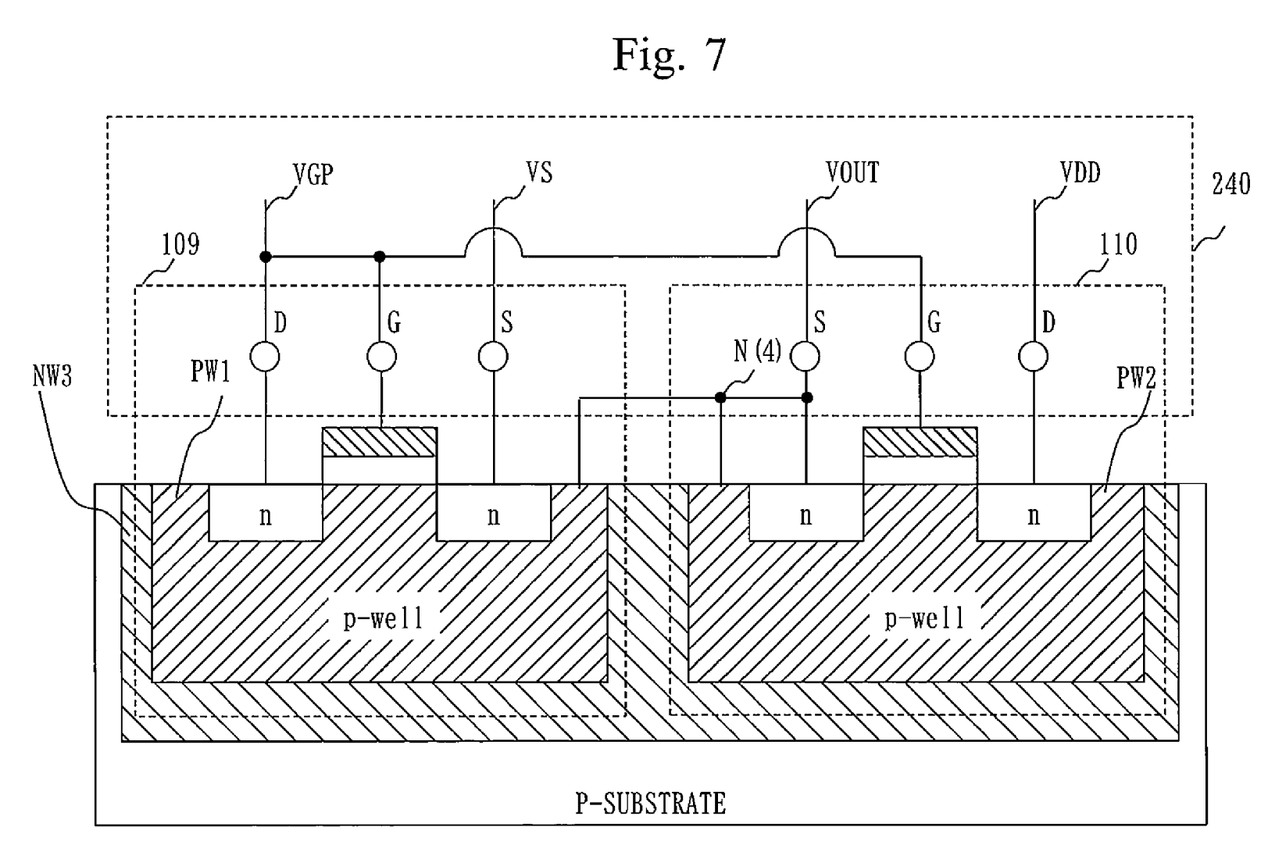
FIG. 7 is a diagram of the first embodiment, which is a diagram illustrating an example of a layout shape of the first nMOSFET 109 and the second nMOSFET 110 of the operational amplifier circuit 200-1.

FIG. 7 is a diagram illustrating a configuration method of the layout of wells in the first nMOSFET 109 and the second nMOSFET 110, corresponding to FIG. 5, in which diagram, n and p are replaced with p and n. As illustrated in FIG. 7, the first p-well PW1 and the second p-well PW2 are separated from each other by the third n-well NW3; further, the first p-well PW1 and the second p-well PW2 are separated from a p-type substrate by the third n-well NW3. The first p-well PW1 and the second p-well PW2 are connected to the fourth node N(4) by the wiring layer 240. Here, the fourth node N(4) is connected to the output terminal VOUT.

Figure 8:
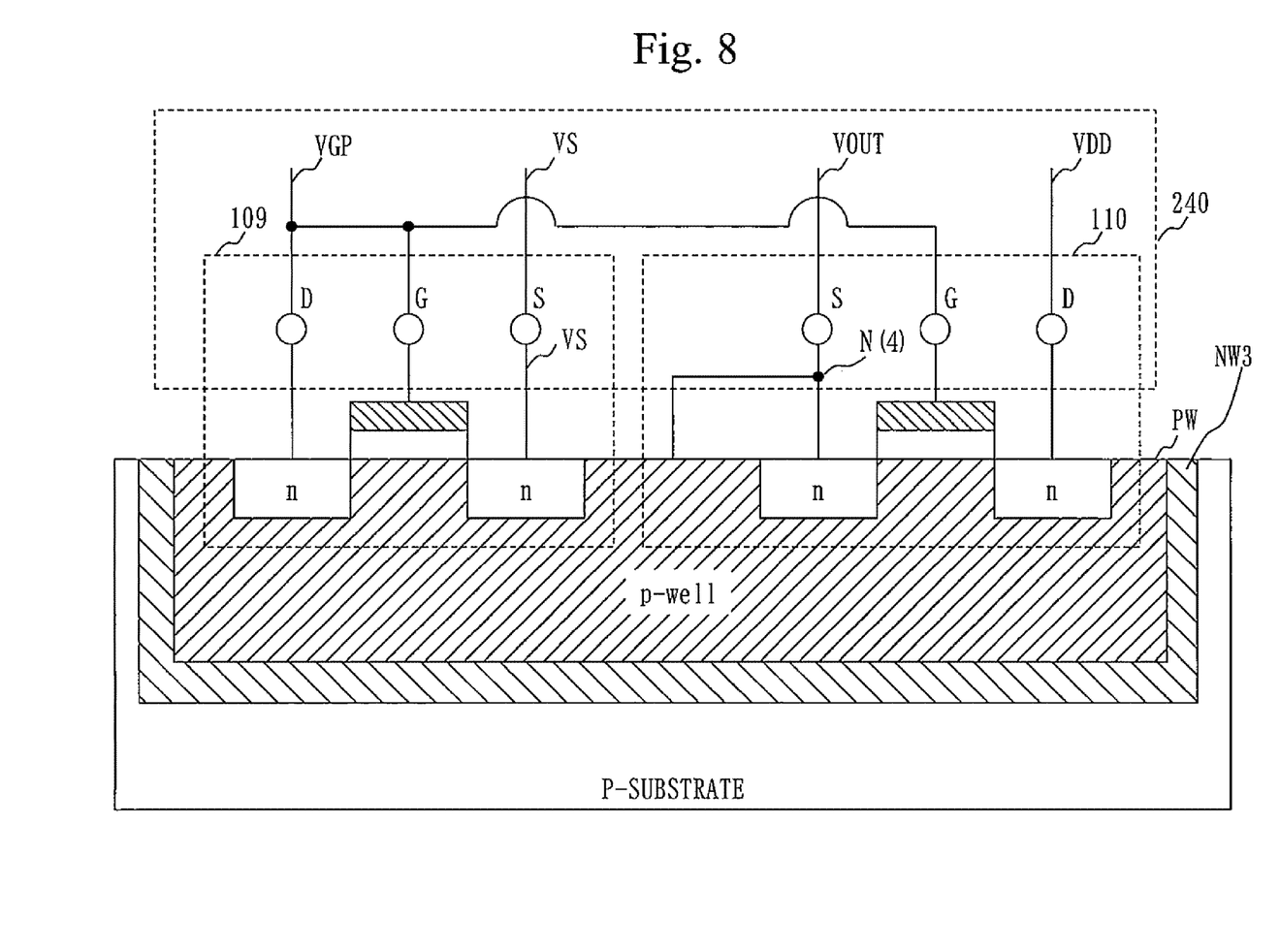
FIG. 8 is a diagram of the first embodiment, which is a diagram illustrating another example of the layout shape of the first nMOSFET 109 and the second nMOSFET 110 of the operational amplifier circuit 200-1.

In relation to the configuration method of the layout of the wells in the first nMOSFET 109 and the second nMOSFET 110, FIG. 8 is a diagram illustrating a case wherein the first nMOSFET 109 and the second nMOSFET 110 are formed on a single p-well PW, corresponding to FIG. 6. As illustrated in FIG. 8, the first p-well PW1 and the second p-well PW2 illustrated in FIG. 7 are formed into a single region by the single p-well PW. The single p-well PW is separated from the p-type substrate by the third n-well NW3. The single p-well PW is connected to the fourth node N(4) by the wiring layer 240. In FIG. 8, the fourth node N(4) is connected to the output terminal VOUT.

Additionally, as illustrated in FIG. 3, the first embodiment has been explained with the configuration wherein both of the well potentials of the first nMOSFET 109 and the second nMOSFET 110, and the first pMOSFET 107 and the second pMOSFET 108 are supplied from the output terminal VOUT; however, it is not limited to this configuration. For example, an electric potential may be supplied only to either well of the nMOSFETs or the pMOSFETs from the output terminal VOUT in such a case wherein a buried layer or an epitaxial layer cannot be used, and the wells of the nMOSFETs cannot be separated from a silicon substrate, and so on. This configuration is as discussed in the explanation for FIG. 4.

Further, one pair of the first nMOSFET 109 and the second nMOSFET 110 as the nMOSFETs, and the first pMOSFET 107 and the second pMOSFET 108 as the pMOSFETs may be replaced with bipolar transistors, and an electric potential may be supplied to the wells of the MOSFETs of the other pair from the output terminal VOUT.

Figure 9:
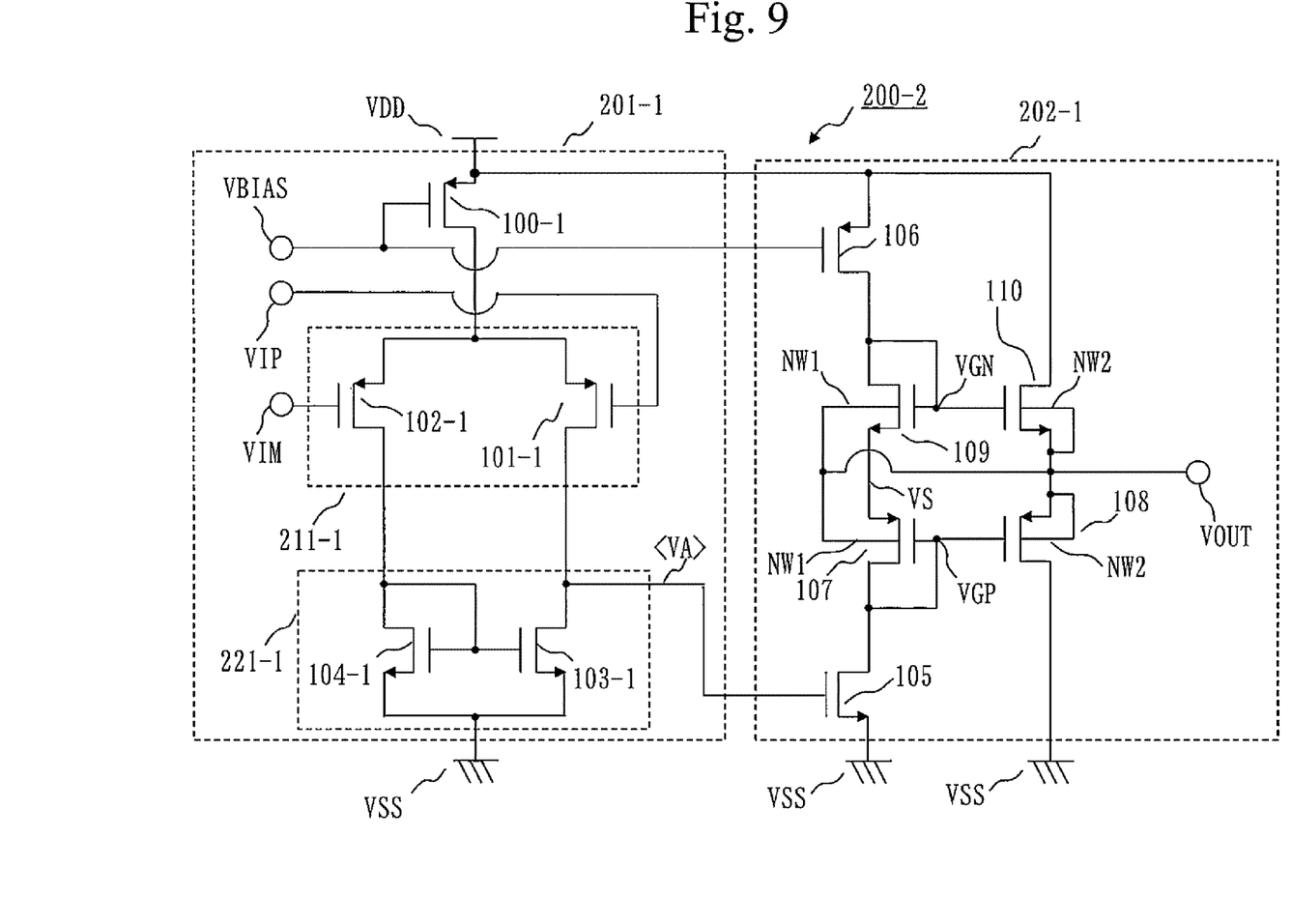
FIG. 9 is a diagram of the first embodiment, which is a circuit diagram of an operational amplifier circuit 200-2.

Furthermore, in the operational amplifier circuit 200-1, since nMOSFETs are used for the differential pair 211 in the differential amplifier stage 201, the third pMOSFET 106 of the output amplifier stage 202-1 is an amplification MOSFET, and the third nMOSFET 105 is a current source MOSFET. That is, in FIG. 3, the differential amplifier stage 201 has the differential pair 211 including two nMOSFETs; however, it is not limited to this configuration. FIG. 9 is a circuit diagram of an operational amplifier circuit 200-2. That is, as the operational amplifier circuit 200-2 as illustrated in FIG. 9, a differential amplifier stage 201-1 has a differential pair 211-1 including two pMOSFETs (pMOSFET 101-1 and pMOSFET 102-1) and has a differential pair 221-1 including two nMOSFETs (nMOSFET 103-1 and nMOSFET 104-1). According to this, the polarity of the MOSFETs in the differential amplifier 201-1 is reverse to that of the differential amplifier stage 201 in FIG. 3. For example, in FIG. 9, the pMOSFET corresponding to the nMOSFET 100 of the differential amplifier stage 201 in FIG. 3 is pMOSFET 100-1. In this manner, with respect to the differential amplifier stage 201 in FIG. 3, the differential amplifier stage 201-1 has the configuration, in which the nMOSFETs are replaced with pMOSFETs and the pMOSFETs are replaced with nMOSFETs, and which is reversed upside down. The configuration reversed upside down is, in other words, the connection is made upside down with respect to the power terminal VDD and the ground terminal VSS. As illustrated in FIG. 9, the gate of the third nMOSFET 105 may receive the output voltage <VA>, and the gate of the third pMOSFET 106 may receive the bias voltage <VBIAS>.

REFERENCE SIGNS LIST

N(1): first node; N(2): second node; N(3): third node; N(4): fourth node; N(5): fifth node; N(6): sixth node; N(7): seventh node; NW1: first n-well; NW2: second n-well; PW1: first p-well; PW2: second p-well; VBIAS: bias input terminal; VIP, VIM: differential input terminal; VOUT: output terminal; VGP: gate terminal; VGN: gate terminal; VDD: power terminal; VSS: ground terminal; <VS>: first output voltage; 200, 200-1, 200-2, 210: operational amplifier circuit; 201, 201-1: differential amplifier stage; 202, 202-1, 203: output amplifier stage; 211, 211-1: differential pair; 221, 221-1: active load; 231: first reference terminal; 232: second reference terminal; 240: wiring layer; 100, 101, 102, 103-1, 104-1: nMOSFET; 100-1, 101-1, 102-1, 103, 104: pMOSFET; 105: third nMOSFET; 106: third pMOSFET; 107: first pMOSFET; 108: second pMOSFET; 109: first nMOSFET; and 110: second nMOSFET.

The invention claimed is:

1. An operational amplifier circuit comprising an output amplifier stage that amplifies a first voltage of a differential amplifier stage outputting the first voltage, and that outputs a voltage that is amplified from an output terminal, wherein the output amplifier stage includes:
 a first nMOSFET in which a first p-well is formed, a gate and a drain which are short-circuited are connected to a first node, and a source is connected to a second node;
 a second nMOSFET in which a second p-well is formed, a gate is connected to the first node, a drain is connected to a first reference terminal, and a source is connected to the output terminal;
 a first pMOSFET in which a first n-well is formed, a gate and a drain which are short-circuited are connected to a third node, and a source is connected to the second node; and
 a second pMOSFET in which a second n-well is formed, a gate is connected to the third node, a drain is connected to a second reference terminal, and a source is connected to the output terminal,
 and wherein the first p-well and the second p-well are connected to a fourth node,
 the first n-well and the second n-well are connected to a fifth node,
 and at least one of the fourth node and the fifth node is connected to the output terminal.

2. The operational amplifier circuit as defined in claim 1, wherein the output amplifier stage further includes:
 a third pMOSFET in which a gate is connected to a sixth node, a drain is connected to the first node, and a source is connected to the first reference terminal; and
 a third nMOSFET in which a gate is connected to a seventh node, a drain is connected to the third node, and a source is connected to the second reference terminal,
 and wherein the first voltage is supplied to one of the sixth node and the seventh node,
 and a bias voltage is supplied to the other of the sixth node and the seventh node.

3. The operational amplifier circuit as defined in claim 1, wherein the first n-well and the second n-well are separated from each other, and are connected to the fifth node by a wiring layer.

4. The operational amplifier circuit as defined in claim 1, wherein the first n-well and the second n-well are formed as a single region by a single n-well, and are connected to the fifth node by a wiring layer.

5. The operational amplifier circuit as defined in claim 1, wherein the first p-well and the second p-well are separated from each other by a third n-well, and are connected to the fourth node by a wiring layer.

6. The operational amplifier circuit as defined in claim 1, wherein the first p-well and the second p-well are formed as a single region by a single p-well, and are connected to the fourth node by a wiring layer.

7. The operational amplifier circuit as defined in claim 1, wherein the differential amplifier stage has a differential pair including two nMOSFETs.

8. The operational amplifier circuit as defined in claim 1, wherein the differential amplifier stage has a differential pair including two pMOSFETs.

* * * * *